United States Patent
Kaneko

(10) Patent No.: US 7,615,924 B2
(45) Date of Patent: Nov. 10, 2009

(54) ORGANIC ELECTROLUMINESCENCE DEVICE PANEL

(75) Inventor: Kumiko Kaneko, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 436 days.

(21) Appl. No.: 11/675,382

(22) Filed: Feb. 15, 2007

(65) Prior Publication Data

US 2007/0216298 A1   Sep. 20, 2007

(30) Foreign Application Priority Data

Mar. 1, 2006   (JP)   ............... 2006-054370
Feb. 6, 2007   (JP)   ............... 2007-026706

(51) Int. Cl.
  *H01J 1/62* (2006.01)
(52) U.S. Cl. ...................... 313/506; 313/504
(58) Field of Classification Search ............. 313/498, 313/504, 506, 512
See application file for complete search history.

(56) References Cited

U.S. PATENT DOCUMENTS

2007/0063648 A1 *  3/2007  Ogata ................... 313/512

FOREIGN PATENT DOCUMENTS

JP   11-204256   7/1999

* cited by examiner

*Primary Examiner*—Vip Patel
(74) *Attorney, Agent, or Firm*—Fitzpatrick, Cella, Harper & Scinto

(57) ABSTRACT

There is provided an organic electroluminescence (EL) device panel including a heat dissipation member formed on a lead-out wiring electrically connected to a first electrode or a second electrode. According to the organic EL device panel of the present invention, the organic EL device is not adversely affected by heat at a time of manufacturing and driving, so deterioration of pixels of the organic EL device is not generated.

5 Claims, 3 Drawing Sheets

ORGANIC ELECTROLUMINESCENCE DEVICE PANEL

BACKGROUND OF THE INVENTION

1. Field of the Invention

The present invention relates to an organic electroluminescence (hereinafter, abbreviated to "EL") device panel.

2. Description of the Related Art

In recent years, an organic EL device which functions as a self-luminous device has been attracting attention for use in a flat panel display. The organic EL device generally has a sandwich structure in which an organic light emitting layer is sandwiched between two electrodes on a glass substrate. To allow light emitted from the organic light emitting layer to be extracted to an outside of the device, a transparent electrode is used as one of the electrodes, generally, an indium tin oxide (ITO) transparent electrode is used as an anode. Further, while an outer circumferential surface of the organic EL device is sealed with a sealing material, a current is caused to flow therein by an external driving circuit to thereby emit light.

The organic EL device that emits light by the principle as described above is used for a display of an in-vehicle audio system, a cellular phone, or the like, or as a display device thereof, since the organic EL device is excellent in visibility and flexibility and can emit light of various colors.

Incidentally, display pixels of the organic EL device panel having those characteristics are driven by a current. In addition, the organic EL device panel has a current dependent characteristic in which a light emission brightness of a pixel varies substantially proportional to a driving current. In particular, in an active drive type organic EL device panel, heat is generated locally at a time of driving. For example, in a case where the number of pixels of the panel is 320×240 pixels, when a current for one pixel is 750 nA, the current can be expressed by 750 nA×3×320×240=173 mA, which means that the current of about 173 mA flows through a single lead-out wiring. A contact resistance portion is provided between the lead-out wiring and a power source wiring, and heat is generated locally to increase a temperature of the lead-out wiring through which the current flows in a concentrated manner, in particular, a temperature of the contact resistance portion between the lead-out wiring and the power source wiring. Accordingly, there has been a problem of deterioration such as shortening of a lifetime of pixels of the organic EL device in the vicinity of the high-temperature portion, or generation and increase of a non-light emitting portion.

On the other hand, the lead-out wiring of a liquid crystal display (hereinafter, abbreviated to "LCD") necessitates connections of a narrow pitch for realizing a display of high fineness. The narrow pitch connection can be realized by using solder or an anisotropic conductive film (hereinafter, abbreviated to "ACF"). In order to cope with the narrow pitch of several hundred µm or less, the connection with an FPC or a TCP corresponding to a plurality of lead-out wirings is preferably made through heat press bonding by using the ACF. The ACF is generally used for mounting the TCP on a liquid crystal display cell.

However, in order to realize a display having high fineness using the organic EL device, when heat press bonding is performed to establish an electrical connection of the lead-out wiring with the FPC as in the case of the LCD, there has been a problem in that image quality of the organic EL device is deteriorated due to heat transfer at the time of performing the press bonding. This is because the organic EL device is sensitive to heat and device characteristics are deteriorated, that is, light emitting efficiency is decreased or the lifetime thereof is shortened, due to the deterioration of the organic light emitting layer accompanying the heating. Thus, the heat press bonding for the connection of the lead-out wiring has been performed in a state where the lead-out wiring and an organic EL device portion are apart from each other to an extent that the deterioration is not generated so that the organic light emitting layer does not become equal to or higher than the temperature at which the deterioration is generated. However, with this method, an interval between a press bonding portion of the lead-out wiring and the organic EL device portion becomes large, so an outline of the organic EL device panel is increased, leading to a hindrance of miniaturization of the frame thereof.

In view of this, Japanese Patent Application Laid-Open No. H11-204256 proposes a method of manufacturing an organic EL device panel, a frame of which can be made small without causing deterioration due to heat press bonding by subjecting the organic EL device to a cooling process at a time of performing the heat press bonding using an ACF so as not to increase a temperature of the organic EL device.

The method of manufacturing an organic EL device panel disclosed in Japanese Patent Application Laid-Open No. H11-204256 involves only the cooling process at the time of manufacturing the panel. Therefore, a problem concerning deterioration due to heat at the time of driving after the panel is formed has not yet been solved. In short, the problem of the conventional organic EL device panel at the time of driving the organic EL device panel still remains. Accordingly, a temperature of the contact resistance portion between the lead-out wiring and the power source wiring becomes high due to the locally generated heat. As a result, deterioration such as shortening of a lifetime of pixels of the organic EL device in the vicinity of the high-temperature portion or generation and increase of the non-light emitting portion cannot be avoided. As a countermeasure, the deterioration due to heat generated at the time of driving can be reduced by increasing the number of the lead-out wiring or by thickening the wiring. However, there is a problem in that the increase in number of the lead-out wiring or the thickening of the wiring may hinder the narrowing of the pitch of the lead-out wiring or the miniaturization of the frame of the organic EL device panel.

SUMMARY OF THE INVENTION

The present invention provides an organic EL device panel in which an organic EL device is not adversely affected by heat at a time of manufacturing and driving of the panel, and in which deterioration of pixels of the organic EL device is not generated.

To solve the above-mentioned problems of the background art, according to an aspect of the present invention, there is provided an organic EL device panel, including: a substrate; a plurality of organic electroluminescence devices each of which is formed on the substrate and includes a first electrode, an organic compound layer, and a second electrode in the stated order from the substrate; a power source wiring including a first power source wiring electrically connected to the first electrode and a second power source wiring electrically connected to the second electrode; a lead-out wiring including a first lead-out wiring electrically connected to the first power source wiring and a second lead-out wiring electrically connected to the second power source wiring; and a heat dissipation member formed on the lead-out wiring.

The organic EL device panel according to the present invention has a heat dissipation portion formed on the lead-out wiring electrically connected to the first electrode or the second electrode. Therefore, heat generation can be suppressed at the time of driving without providing the plurality of lead-out wirings or thickening the wiring. Further, heat generation can be suppressed even when the lead-out wiring has a narrow pitch connection. In addition, even at the time of manufacturing, an amount of heat to be transferred to the organic EL device can be suppressed. Thus, the organic EL device is not adversely affected by heat, and deterioration such as shortening of the lifetime of image quality of the organic EL device or generation and increase of the non-light emitting portion is not produced.

Further features of the present invention will become apparent from the following description of exemplary embodiments with reference to the attached drawings.

DESCRIPTION OF THE EMBODIMENTS

Hereinafter, an organic EL device panel according to an embodiment mode of the present invention will be described with reference to the drawings.

Figure 1A:
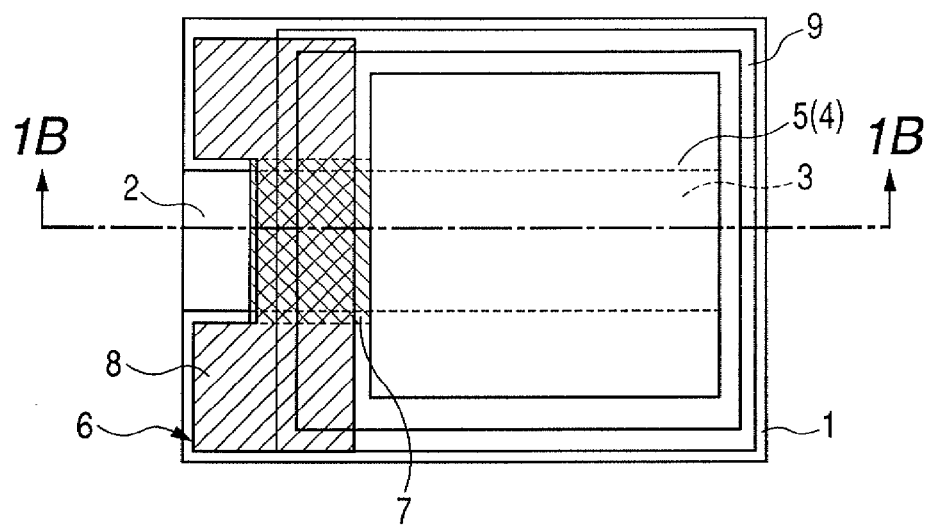
FIG. 1A is a plan view schematically illustrating an organic EL device panel according to the present invention.
Figure 1B:
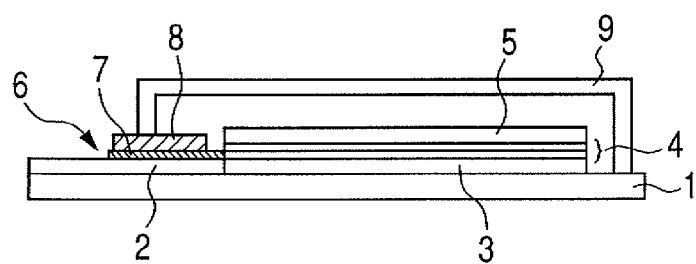
FIG. 1B is a sectional view taken along the line 1B-1B of FIG. 1A.
Figure 1C:
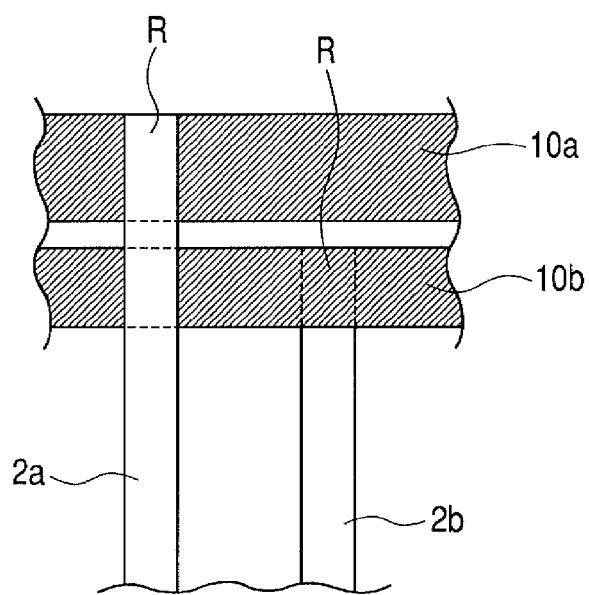
FIG. 1C is a view for illustrating a contact resistance portion between a lead-out wiring and a power source wiring.

FIG. 1A is a plan view schematically illustrating the organic EL device panel. FIG. 1B is a sectional view taken along the line 1B-1B of FIG. 1A. FIG. 1C is an explanatory view illustrating a contact resistance portion between a lead-out wiring and a power source wiring. The contact resistance portion is an extremely small portion. FIG. 1C schematically illustrates an enlarged view of the contact resistance portion. In FIGS. 1A to 1C, the organic EL device panel includes a glass substrate 1, a lead-out wiring 2, a first electrode 3, an organic light emitting layer 4, an ITO film (second electrode) 5, a heat dissipation member 6, an insulating layer 7, a metal film 8, a sealing glass (sealing member) 9, a power source wiring 10, and a contact resistance portion R. A first lead-out wiring 2a of the lead-out wiring 2 is connected to the first electrode 3 via the power source wiring 10. A second lead-out wiring 2b of the lead-out wiring 2 is connected to the second electrode 5 via the power source wiring 10. Further, a first power source wiring 10a of the power source wiring 10 is connected to the first electrode 3, and a second power source wiring 10b of the power source wiring 10 is connected to the second electrode 5. The contact resistance portion R between the lead-out wiring 2 and the power source wiring 10 is a part of the lead-out wiring 2, so a portion in contact with the power source wiring 10 is referred to as "contact resistance portion R" in particular.

The organic EL device panel illustrated in FIGS. 1A to 1C includes as main components, the first electrode 3, the organic light emitting layer 4, and the second electrode 5, all of which are formed on the glass substrate 1, and the sealing glass 9 seals the organic EL devices such as the organic light emitting layer 4.

A current to be supplied to each of the devices is supplied to the first electrode 3 of each device via the lead-out wiring 2 and the power source wiring 10 from a current supplying portion (not shown). The lead-out wiring 2 and the power source wiring 10 are electrically connected through the contact resistance portion R. The heat dissipation member 6 is formed on the lead-out wiring 2 (note that a press-bonded portion with the FPC or the like is excluded) electrically connected with the power source wiring 10 via the contact resistance portion R and in the peripheral region thereof (region where no lead-out wiring 2 or first electrode 3 is formed on the glass substrate 1).

The heat dissipation member 6 includes the insulating layer 7 formed on the lead-out wiring 2 and the metal film 8 formed on and in the peripheral region of the insulating layer 7 in a continuous manner (note that the metal film 8 need not be continuous). The heat dissipation member 6 is formed on the lead-out wiring 2. However, the heat dissipation member 6 may be formed on the power source wiring 10, which enables further reduction of influence of heat. The heat dissipation member 6 is formed to extend from within the sealing glass 9 to the outside thereof so that the heat generated at the time of driving is not accumulated in the sealing glass 9. The sealing glass 9 keeps the organic EL device in an airtight space and protects the organic EL device from substances that damage the organic EL device, such as moisture and oxygen. In other words, the state where the heat dissipation member 6 is formed to extend from within the sealing glass 9 to the outside thereof means that the heat dissipation member 6 extends from within the airtight space to the outside thereof. The insulating layer 7 may be formed of any material as long as the material is an insulating material, but is preferably formed of a material with good heat conductivity. The metal film 8 may be formed of any material as long as a metal film can be formed, but is preferably formed of a material with good heat conductivity. The metal film 8 exhibits higher heat dissipation effect as the thickness increases, which is preferable. Specific examples of the material with good heat conductivity include Ag, Cu, Au, and Al. However, as in the examples described below, when the metal film 8 is formed of the same material as that of the lead-out wiring or the first electrode, that is, Cr, a manufacturing process can be further simplified. Incidentally, bonding of a metal piece (not shown) to a part of the metal film 8 increases a surface area of the heat dissipation member, leading to further enhancement of the heat dissipation effect, which is preferable. The larger the number of the metal pieces, the higher the heat dissipation effect. Alternatively, the surface area of the heat dissipation member is also increased by employing a structure of, for example, a heat sink, in which fine protrusions or a plurality of plate-like members (fins) are aligned with a regularity on a surface of the metal film, leading to an increase in the heat dissipation effect. The metal piece may be bonded within the airtight space. Further, the heat dissipation effect is further increased when the metal piece is bonded within and outside the airtight space.

In the organic EL device panel having the structure as described above, heat generated at the contact resistance portion R between the lead-out wiring 2 and the power source wiring 10 at the time of driving is dissipated from the heat dissipation member 6. Therefore, even when the lead-out wiring 2 has a narrow pitch connection, heat generation of the lead-out wiring 2 and the contact resistance portion R can be suppressed without increasing the number of or thickening the lead-out wiring 2. In addition, heat transfer to the organic EL device can be suppressed also at the time of manufacturing. Thus, the organic EL device is not adversely affected by heat, so deterioration such as shortening of lifetime of image quality of the organic EL device or generation and increase of the non-light emitting portion is not caused.

The organic EL device panel illustrated in FIGS. 1A to 1C is manufactured as described below.

First, a TFT circuit is formed on the glass substrate 1, and a flattening film (not shown) is formed thereafter. Next, a device separation film (not shown) is formed after the lead-out wiring 2 and the first electrode 3 are formed by an anode metal material. Then, the organic light emitting layer 4 is formed on the first electrode 3 via the device separation film, and the ITO film 5 is formed. It should be noted that in this embodiment mode, the lead-out wiring 2 and the first electrode 3 are formed through a single step. However, the two members may be formed in different steps.

The insulating layer 7 is formed on the lead-out wiring 2. Next, the metal film 8 is formed on and in the peripheral region of the insulating layer 7 in a continuous manner. After that, the sealing glass 9 and the glass substrate 1 are sealed by curing an adhesive. Finally, mounting of the FPC and sealing and curing of a resin are performed to complete the organic EL device panel.

In the embodiment mode described above, the heat dissipation member 6 is formed on the lead-out wiring 2 electrically connected with the first electrode 3. However, the heat dissipation member 6 may be formed on the lead-out wiring (not shown) electrically connected with the second electrode 5. In addition, the first electrode 3 is used as an anode electrode and the second electrode 5 is used as a cathode electrode in this embodiment mode. However, this embodiment mode can be carried out with the first electrode 3 being the cathode electrode and the second electrode 5 being the anode electrode. Further, the organic EL device panel according to this embodiment mode is a top emission type panel. However, the organic EL device panel may be a bottom emission type panel.

In the embodiment mode described above, the insulating layer 7 is formed on the lead-out wiring 2 and the metal film 8 is formed on the insulating layer 7. This is because a short circuit is caused between the first lead-out wiring 2a and the second lead-out wiring 2b when the metal film 8 is directly formed on the lead-out wiring 2. However, when the metal film 8 is selectively arranged such that a short circuit is not caused between the first lead-out wiring 2a and the second lead-out wiring 2b, the metal film 8 can be arranged directly on the lead-out wiring 2. Further, only the insulating layer 7 may be formed on the lead-out wiring 2. In short, it is only necessary that the heat dissipation member 6 be formed on the lead-out wiring 2.

EXAMPLE 1

An organic EL device panel according to an example of the present invention will be described in accordance with manufacturing steps. It should be noted that the organic EL device panel according to the present invention is not limited to that in the following embodiment and may be variously modified without departing from the gist of the present invention.

Figure 2:
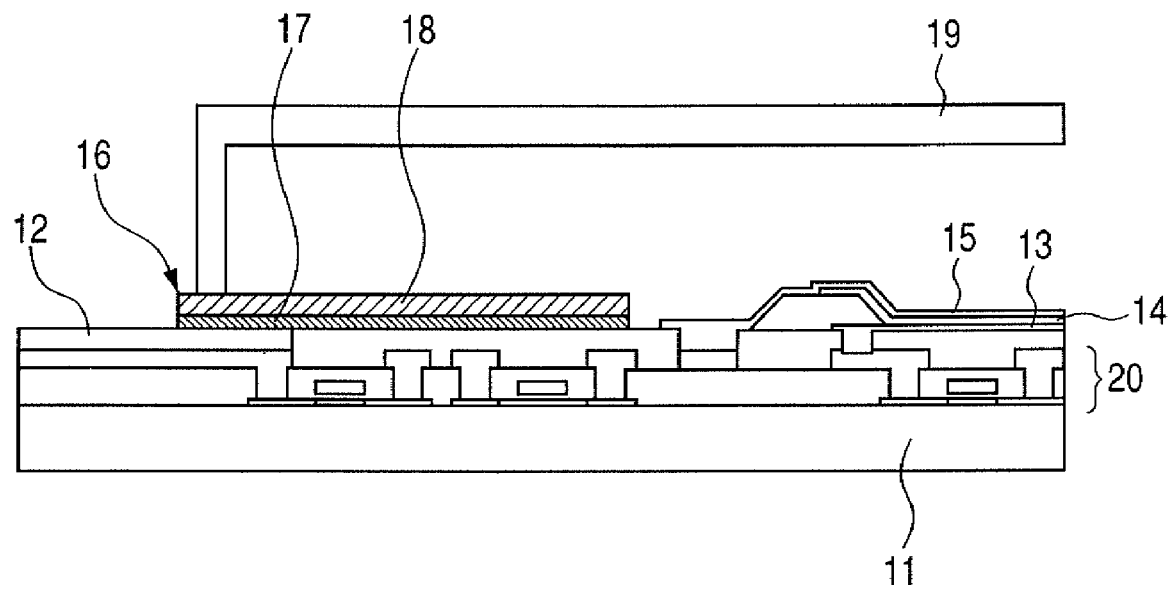
FIG. 2 is a partially enlarged sectional view illustrating an organic EL device panel according to Example 1 of the present invention.

The organic EL device panel illustrated in FIG. 2 is an active drive type organic EL device panel. FIG. 2 is a partially enlarged sectional view of the organic EL device panel. In FIG. 2, the organic EL device panel includes a glass substrate 11 on which a TFT circuit 20 is formed, a lead-out wiring 12, a first electrode 13, an organic light emitting layer 14, an ITO film (second electrode) 15, a heat dissipation member 16, an insulating layer 17, a metal film 18, and a sealing glass 19. A configuration of a contact resistance portion between the lead-out wiring 12 and the power source wiring is similar to that illustrated in FIG. 1C.

(Formation of Lead-Out Wiring 12 and First Electrode 13)

A Cr film having a thickness of 100 nm was formed on the glass substrate 11 on which the TFT circuit 20 was formed, by DC sputtering of a Cr target. After that, the lead-out wiring 12 was formed on an outer circumferential portion of the glass substrate 11 and the first electrode 13 was formed at a position corresponding to each pixel, by a photo-etching method. The power source wiring is omitted in FIG. 2. The power source wiring and the lead-out wiring 12 had a laminate structure, each of the layers being formed of a Cr film.

(Formation of Insulating Layer 17)

After a positive resist type photosensitive organic resin material was applied with a film thickness of 1 μm by a spin coating method and a pre-bake was performed thereafter, a portion corresponding to a light emitting portion on the Cr electrode and the outer circumferential portion of a display region were exposed to light by using a photo-mask. After that, the exposed portions were removed with a developer and the resin was cured through a post-bake at 230° C., thereby forming the insulating layer 17.

(Formation of Organic Light Emitting Layer 14)

The glass substrate 11 on which the layers up to the insulating layer 17 had been formed was transferred from a pre-process room to a film formation room. After air in the film formation room was exhausted down to $1 \times 10^{-4}$ Pa, the organic light emitting layer 14 having the film thickness of 15 nm was formed by a resistance heating deposition method using Alq3, which was an alkylate complex, under the condition of a film forming rate of 0.2 to 0.3 nm/sec.

(Formation of ITO Film 15 (Cathode Electrode))

The glass substrate 11 on which layers up to the organic light emitting layer 14 had been formed was transferred to another film formation room. The ITO film 15 which was the second electrode was formed on the organic light emitting layer 14 by covering a Cr pixel electrode through mask formation so that the ITO film 15 had a film thickness of 130 nm, by a DC magnetron sputtering method using an ITO target.

Through the above-mentioned steps, the organic EL device having the lead-out wiring 12, the first electrode 13, the insulating layer 17, the organic light emitting layer 14, and the ITO film 15 formed on the glass substrate 11 was formed.

(Formation of Metal Film 18)

The glass substrate 11 on which the organic EL devices had been formed was transferred to another film formation room. The Cr film which was the metal film 18 was formed in a continuous manner by the DC sputtering of the Cr target and by the mask formation to cover the insulating layer 17 and a peripheral region thereof on the glass substrate 11. As a result, the metal film 18 and the insulating layer 17 formed the heat dissipation member 16.

(Sealing Step)

The glass substrate 11 on which layers up to the metal film 18 had been formed was sealed with the sealing glass 19. A bottom portion of the circumference of the sealing glass 19 was applied with an ultraviolet-curable adhesive (not shown) to be cured by irradiation of light for 60 seconds.

The organic EL device panel according to the present invention was formed by the above-mentioned steps.

(Mounting Step)

Mounting of the FPC which was necessary for connecting the organic EL device panel with a driving circuit for driving the organic EL device panel was carried out.

First, an ACF (not shown) was temporarily press-bonded to the lead-out wiring 12 of the organic EL device panel. Subsequently, an alignment mark of the lead-out wiring 12 and an alignment mark of the FPC (not shown) were aligned. After that, the lead-out wiring 12 and the FPC were placed below a heater head (temperature: 230° C.) to thereby perform bonding of the FPC by carrying out heat press bonding under a pressure of 3 MPa for 12 seconds via a Teflon™ tape having a thickness of 50 μm.

(Resin Sealing Step)

Sealing of the organic EL device panel with a resin, which was bonded with the FPC was carried out. A portion at which the lead-out wiring 12 of the organic EL device panel and the FPC were press-bonded was applied with an acrylic ultraviolet-curable resin (not shown), and light was irradiated for 15 seconds to cure the sealing resin.

Through the above-mentioned steps, the manufactured organic EL device panel was connected to the driving circuit substrate, and the organic EL device panel was driven for a long time by causing a current of 150 mA to flow through a single lead-out wiring 12. Even when the organic EL device panel was driven for a long time, heat generation of the contact resistance portion between the lead-out wiring 12 and the power source wiring due to the current was suppressed. In addition, heat transfer to the organic EL device in the mounting step (at the time of manufacturing) was also suppressed at a low level. Accordingly, the organic EL device was hardly affected by heat, so deterioration such as the shortening of lifetime of image quality of the organic EL device or the generation and increase of the non-light emitting portion was not produced. Further, the frame of the organic EL device panel could be made narrow.

EXAMPLE 2

Figure 3A:
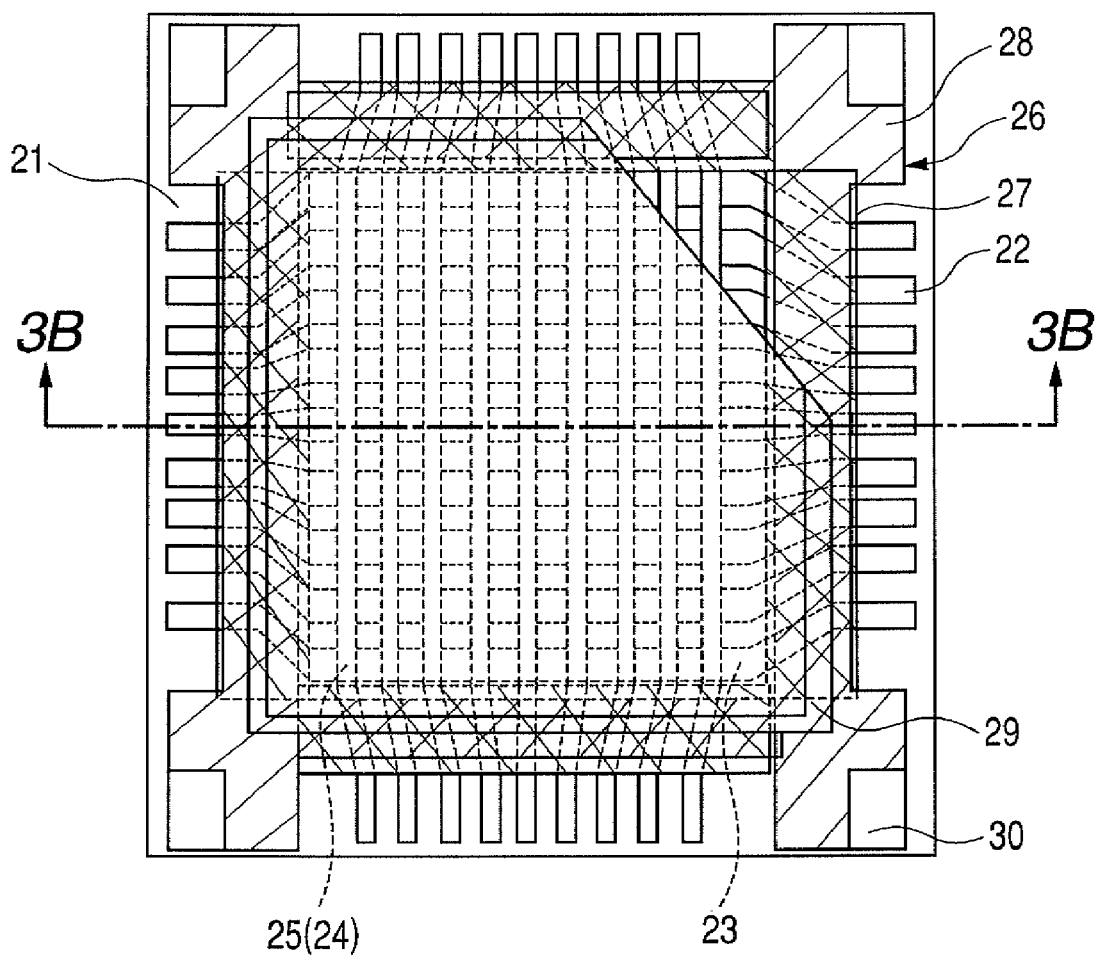
FIG. 3A is a plan view schematically illustrating an organic EL device panel according to Example 2 of the present invention.
Figure 3B:
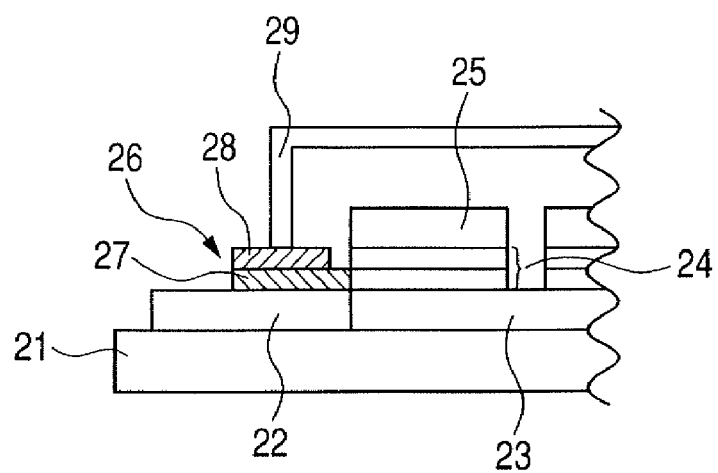
FIG. 3B is a sectional view taken along the line 3B-3B of FIG. 3A.

Another example of the organic EL device panel according to the present invention will be described in accordance with the manufacturing steps. The organic EL device panel illustrated in FIGS. 3A and 3B is a passive drive type organic EL device panel. FIG. 3A is a plan view schematically illustrating the organic EL device panel. FIG. 3B is a partial sectional view taken along the line 3B-3B of FIG. 3A. In FIGS. 3A and 3B, the organic EL device panel includes a grass substrate 21, a lead-out wiring 22, a first electrode 23, an organic light emitting layer 24, an ITO film (second electrode) 25, a heat dissipation member 26, an insulating layer 27, a metal film 28, a sealing glass 29, and a metal piece 30. It should be noted that the manufacturing steps of the organic EL device panel according to this example is similar to those of Example 1 except that a shape and film thickness of a mask are slightly different through steps of formation of the lead-out wiring 22 to formation of the ITO film 25. Therefore, description thereof will be omitted.

(Formation of Metal Film 28)

The glass substrate 21 on which the organic EL devices had been formed was transferred from the ITO film formation room to another film formation room. The Cr film which was the metal film 28 was formed in a continuous manner by the DC sputtering of the Cr target and the mask formation so as to cover the insulating layer 27 on the glass substrate 21 and the four corners of the glass substrate 21 on which the lead-out wiring 22 or the first electrode 23 was not formed. As a result, the metal film 28 and the insulating layer 27 formed the heat dissipation member 26. At this time, unlike the first embodiment, the metal film 28 was formed on all four corners (outer circumferential portion) of the glass substrate 21.

(Sealing Step)

The glass substrate 21 on which layers up to the metal film 28 had been formed was sealed with the sealing glass 29. A bottom portion of the circumference of the sealing glass 29 was applied with an ultraviolet-curable adhesive (not shown) to be cured by irradiation of light for 60 seconds, thereby forming the organic EL device panel.

(Bonding Step of Metal Piece 30)

The metal films 28 at the four corners, which were extended to the outside of the sealing glass 29, were respectively bonded with the metal pieces 30 by soldering.

(Mounting Step)

Mounting of the FPC which was necessary for connecting the organic EL device panel with the driving circuit for driving the organic EL device panel was carried out.

First, an ACF (not shown) was temporarily press-bonded to the lead-out wiring 22 of the organic EL device panel. Subsequently, an alignment mark of the lead-out wiring 22 and an alignment mark of the FPC (not shown) were aligned. After that, the lead-out wiring 22 and the FPC were placed below a heater head (temperature: 230° C.) to thereby perform bonding of the FPC by carrying out heat press bonding under a pressure of 3 MPa for 12 seconds via a Teflon (registered trademark) tape having a thickness of 50 μm. The FPC bonding with respect to the organic EL device panel was completed when the above-mentioned step was carried out on all four corners of the organic EL device panel.

(Resin Sealing Step)

Sealing of the organic EL device panel with a resin, which was bonded with the FPC was carried out. Portions at which the lead-out wiring 22 of the organic EL device panel and the FPC were press-bonded, that is, outer circumferential portion of the organic EL device panel, were applied with an acrylic ultraviolet-curable resin, and light was irradiated for 15 seconds each to cure the sealing resin.

The organic EL device panel had been manufactured through the above-mentioned steps was connected to the driving circuit substrate, thereby driving the organic EL device panel for a long time. However, heat generation of the contact resistance portion between the lead-out wiring 22 and the power source wiring due to the current was suppressed. In addition, heat transfer to the organic EL device in the mounting step was also suppressed at a low level. Accordingly, even when the lead-out wiring 22 was connected with a narrow pitch, the organic EL device was not adversely affected by heat, so deterioration such as the shortening of lifetime of image quality of the organic EL device or the generation and increase of the non-light emitting portion was not produced. Further, the frame of the organic EL device panel could be made narrow.

Further, because the metal pieces 30 were respectively bonded to portions of the metal films 28, heat was dissipated from each of the metal pieces 30 at the time of both the driving and manufacturing of the organic EL device panel. Therefore, deterioration due to heat transfer to the organic EL device could be further suppressed.

While the present invention has been described with reference to examples, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-054370, filed Mar. 1, 2006, and Japanese Patent Application No. 2007-026706, filed Feb. 6, 2007, which are hereby incorporated by reference herein in their entirety.

What is claimed is:

1. An organic electroluminescence device panel, comprising:
   a substrate;
   a plurality of organic electroluminescence devices each of which is formed on the substrate and includes a first electrode, an organic compound layer, and a second electrode in the stated order from the substrate;
   a power source wiring including a first power source wiring electrically connected to the first electrode and a second power source wiring electrically connected to the second electrode;
   a lead-out wiring including a first lead-out wiring electrically connected to the first power source wiring and a second lead-out wiring electrically connected to the second power source wiring; and
   a heat dissipation member formed on the lead-out wiring.

2. The organic electroluminescence device panel according to claim 1, further comprising a sealing member provided on the plurality of organic electroluminescence devices, for keeping the organic electroluminescence devices in an airtight space,
   wherein the heat dissipation member extends from within the airtight space to an outside of the airtight space.

3. The organic electroluminescence device panel according to claim 1, wherein the heat dissipation member comprises an insulating layer formed on the lead-out wiring and a metal film formed on the insulating layer.

4. The organic electroluminescence device panel according to claim 3, wherein the metal film is formed to extend to a peripheral region of the lead-out wiring in a continuous manner.

5. The organic electroluminescence device panel according to claim 3, wherein the metal film is provided with a metal piece.

* * * * *